(12) United States Patent
Ezawa et al.

(10) Patent No.: US 9,157,965 B2
(45) Date of Patent: Oct. 13, 2015

(54) STORAGE BATTERY DETERIORATION DIAGNOSIS SYSTEM AND METHOD THEREOF

(71) Applicants: Toru Ezawa, Kawasaki (JP); Akihiro Itakura, Kawasaki (JP)

(72) Inventors: Toru Ezawa, Kawasaki (JP); Akihiro Itakura, Kawasaki (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 406 days.

(21) Appl. No.: 13/671,862

(22) Filed: Nov. 8, 2012

(65) Prior Publication Data

US 2013/0113492 A1  May 9, 2013

(30) Foreign Application Priority Data

Nov. 9, 2011  (JP) ................................. 2011-245504

(51) Int. Cl.
*G01R 31/36* (2006.01)
*B60L 11/18* (2006.01)
*H01M 10/48* (2006.01)
*H01M 10/42* (2006.01)

(52) U.S. Cl.
CPC ......... *G01R 31/3627* (2013.01); *B60L 11/1851* (2013.01); *G01R 31/3651* (2013.01); *G01R 31/3658* (2013.01); *G01R 31/3679* (2013.01); *H01M 10/486* (2013.01); *G01R 31/3675* (2013.01); *H01M 2010/4278* (2013.01)

(58) Field of Classification Search
CPC .................................................. G01R 31/3648
USPC .......................................................... 324/426
See application file for complete search history.

(56) References Cited

U.S. PATENT DOCUMENTS 6,468,689 B1 * 10/2002 Hallaj et al. ................... 429/120
2009/0130538 A1 * 5/2009 Kaita et al. ....................... 429/50

FOREIGN PATENT DOCUMENTS

JP     2007-311065    11/2007
JP     2009-99375      5/2009

\* cited by examiner

*Primary Examiner* — Samuel Berhanu
*Assistant Examiner* — Jerry D Robbins
(74) *Attorney, Agent, or Firm* — Oblon, McClelland, Maier & Neustadt, L.L.P.

(57) ABSTRACT

There is provided a storage battery deterioration diagnosis system, including: a cell-list creator configured to select diagnosis target cells from among a plurality of cells in a storage battery system, and create a list of the diagnosis target cells; a cell deterioration diagnoser configured to obtain degradation degrees of the diagnosis target cells; a temperature distribution estimator configured to estimate degradation degrees of non-target cells other than the diagnosis target cells, based on a distance between the non-target cell and the diagnosis target cells, and obtain temperature distribution of a whole of the plurality of cells based on degradation degrees of the diagnosis target cells and the degradation degrees of the non-target cells; and a cell-list updater configured to update the list of the diagnosis target cells based on the temperature distribution.

13 Claims, 9 Drawing Sheets

DETERIORATION DIAGNOSIS
TARGET CELL LIST

CELL (2, 2)
CELL (2, 6)
CELL (2, 10)
CELL (2, 14)
CELL (2, 17)
CELL (6, 2)
CELL (6, 6)
 •
 •
 •

FIG. 6

STORAGE BATTERY DETERIORATION DIAGNOSIS SYSTEM AND METHOD THEREOF

CROSS REFERENCE TO RELATED APPLICATIONS

This application is based upon and claims the benefit of priority from the prior Japanese Patent Application No. 2011-245504, filed on Nov. 9, 2011, the entire contents of which are incorporated herein by reference.

FIELD

Embodiments described herein relate to a storage battery deterioration diagnosis system and a method thereof, and for example, relates to diagnosis of cell degradation in a storage battery system including a plurality of cells.

BACKGROUND

For renewable energy such as PV (photovoltaic) and stabilization of an electric power system, and EV (an electric vehicle), etc., the role of a storage battery has been becoming very important. In order to respond to various usage situations, a storage battery system is a form in which a storage battery having a plurality of battery cells (hereinafter referred to as cells) configured to be connected to each other (battery pack) is used. The storage battery system is desired to be able to be used safely and with confidence, and it is important for the storage battery system not to be easily degraded as a whole.

Recently, with electronization of all electronic devices and living environments, large capacity has been increasingly desired for the storage battery system, and the number of connected cells that constitute one storage battery system has become extremely large. Today, a storage battery system including on the order of several thousand cells is used for an EV.

In the storage battery system including a storage battery constituted by a plurality of cells, due to variation in individual composition of each of the cells, the degree of degradation varies for each of the cells by repeated charging and discharging. In a conventional storage battery system, when one cell is degraded, it is necessary that capacities of normal cells be made uniform with the degraded cell, so that the performance of the whole storage battery system is degraded, and the degradation may further cause the failure of the storage battery system itself. In this case, there are also a plurality of cells that are not degraded yet in the storage battery system, and the storage battery system is forced to be replaced undesirably before these normal cells run out of the performance.

On the other hand, in order to save such a waste, it is conceivable that the performance of the storage battery system is recovered by replacing the degraded cell. However, in a large-scale storage battery system, for example, it is difficult to detect which cells are notably degraded because a storage battery including several tens of thousands of cells is mounted therein. If a degraded cell is sequentially searched for, deterioration diagnosis is needed to be performed on several tens of thousands of cells, so that the searching work unfortunately becomes very time consuming.

BRIEF DESCRIPTION OF THE DRAWINGS

FIG. 6 is a diagram illustrating a list of the deterioration diagnosis target cells;

DETAILED DESCRIPTION

Figure 1:
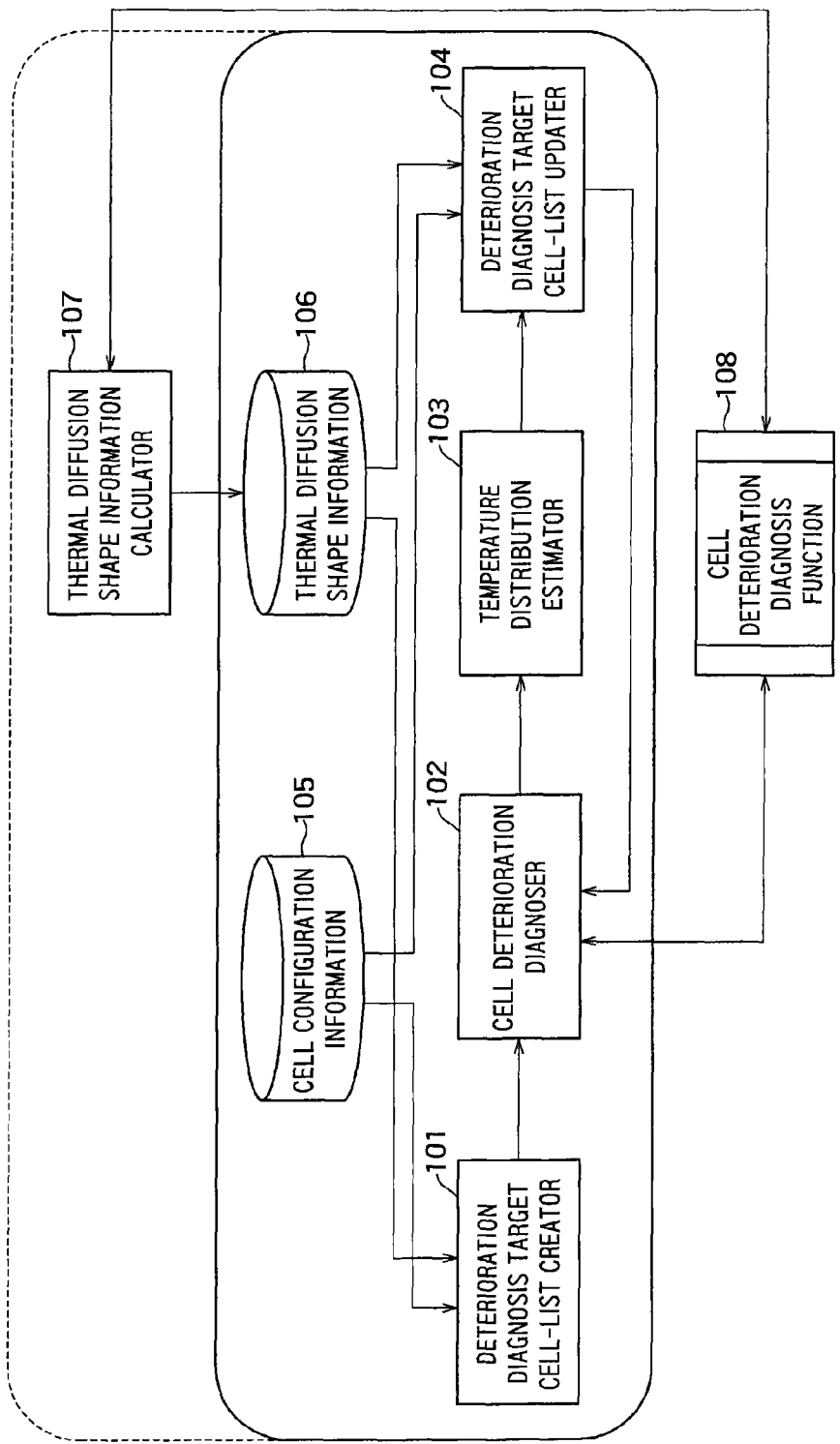
FIG. 1 is a block diagram illustrating a configuration of a storage battery deterioration diagnosis system according to one embodiment.

According to some embodiments, there is provided a storage battery deterioration diagnosis system, including: a cell-list creator, a cell deterioration diagnoser, a temperature distribution estimator and a cell-list updater.

The cell-list creator selects diagnosis target cells from among a plurality of cells in a storage battery system, and creates a list of the diagnosis target cells.

The cell deterioration diagnoser obtains degradation degrees of the diagnosis target cells by performing deterioration diagnosis on the diagnosis target cells on the list, or by issuing a request of deterioration diagnosis of the diagnosis target cells to an external deterioration diagnosis device.

The temperature distribution estimator estimates degradation degrees of non-target cells other than the diagnosis target cells on the list, among the plurality of cells, based on distances between the non-target cell and the diagnosis target cells, and obtains temperature distribution of a whole of the plurality of cells based on degradation degrees of the diagnosis target cells and the degradation degrees of the non-target cells.

The cell-list updater updates the list of the diagnosis target cells based on the temperature distribution.

Hereinafter, embodiments will be described with the accompany drawings.

First, a circumstance that the embodiment has been led to be conceived is described.

In a storage battery system that includes a storage battery constituted by a plurality of cells, it has been found that degradation of a cell can be explained by the temperature of the cell by volunteer studies, and the cell has a tendency to be degraded at an accelerated rate especially when a state of high temperature continues long. In addition, generally, the degradation of cell increases internal resistance, that is, electric power and calorific power that are represented by "(current value)$^2$*(resistance value)" is increased. Thus, inside the storage battery, an area having a high temperature has a tendency that the cell is degraded, or conversely, it can be said that the degraded cell has a tendency that the temperature is increased because the internal resistance is high and a calorific power is large therein.

Heat generated in the cell has a characteristic of thermal diffusion that propagates heat to physically adjacent cells and circuit-connected cells (hereinafter referred to as adjacent cells). The propagation includes space propagation and connection propagation. It is qualitatively highly probable that an adjacent cell of one degraded cell is degraded due to the degraded cell. That is, in the temperature distribution estimated by the temperature distribution estimation function, a cell in an area having a high temperature would be degraded, and because of that, it is highly probable that an adjacent cell of the degraded cell is also degraded. Thus, in order to grasp the degradation condition of the whole storage battery system, it may be efficient that the deterioration diagnosis is intensively performed on the area having a high temperature.

Therefore, according to the embodiment, there is provided a method of effectively grasping the degradation degree of cells in the whole storage battery system using the temperature distribution.

The embodiment is described hereinafter with reference to the accompanying drawings.

<Outline>

Figure 2:
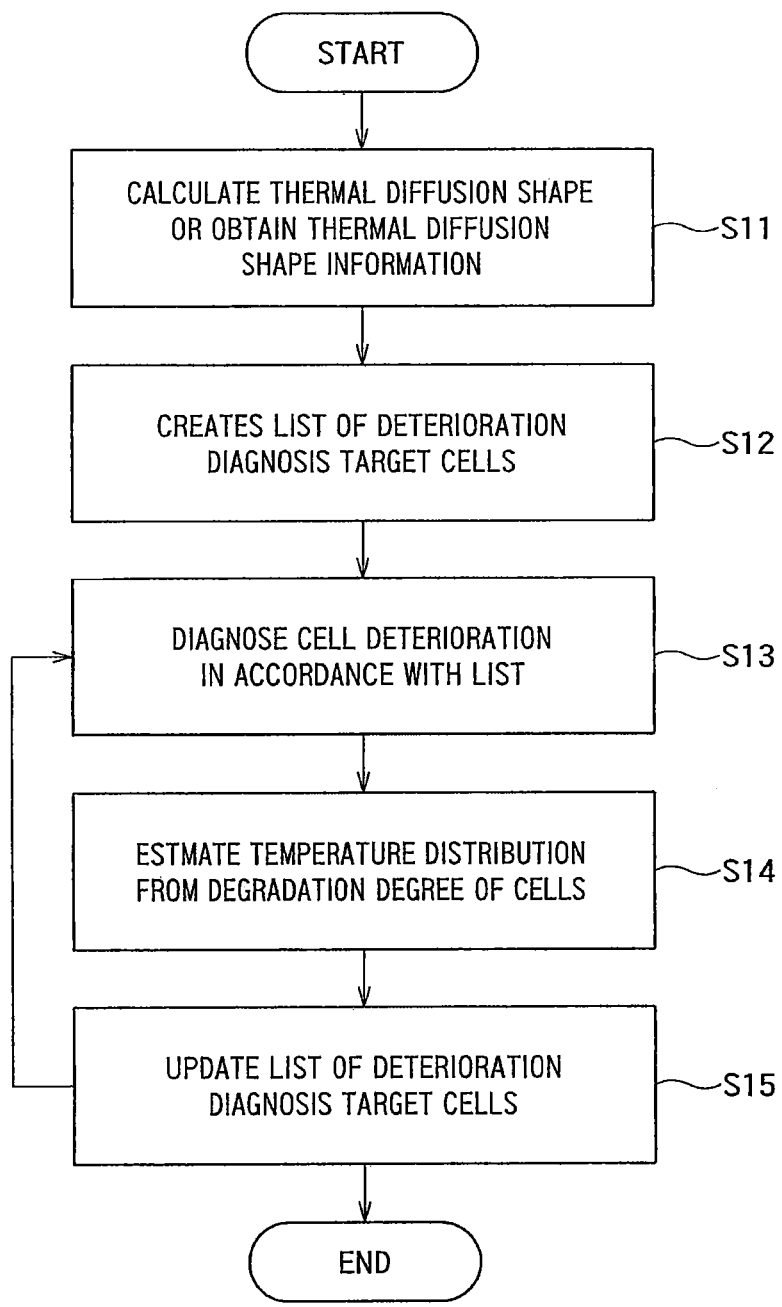
FIG. 2 is a flowchart indicating an operations flow of storage battery deterioration diagnosis system illustrated in FIG. 1.

FIG. 1 is a block diagram of a storage battery deterioration diagnosis system according to one embodiment, and FIG. 2 is a flowchart of a degraded cell detection method according to one embodiment.

As indicated by the closing line of the solid line in FIG. 1, the storage battery deterioration diagnosis system illustrated in FIG. 1 includes a deterioration diagnosis target cell-list creator 101, a cell deterioration diagnoser 102, a temperature distribution estimator 103, a deterioration diagnosis target cell-list updater 104, cell configuration information 105, and some thermal diffusion shape information 106. A thermal diffusion shape information calculator 107 is provided outside of the system, but the thermal diffusion shape information calculator 107 may be included in the system as indicated by the closing line of the dotted line in FIG. 1. Similarly, a cell deterioration diagnosis function (cell deterioration diagnosis device) 108 is provided outside the system, but the cell deterioration diagnosis function 108 may be included in the system.

First, in the system, the thermal diffusion shape information 106 is obtained beforehand (Step S11). When the thermal diffusion shape information calculator 107 is included in the system, the thermal diffusion shape information 106 is obtained by the thermal diffusion shape information calculator 107. The thermal diffusion shape information 106 includes information on the shape of heat diffusion indicating, for a cell that is included in the storage battery system as a diagnosis target, the strength and shape of diffusion of heat generated from the cell to an adjacent cell.

The deterioration diagnosis target cell-list creator 101 selects cells that are deterioration diagnosis targets so as to be able to comprehensively diagnose the degradation degree of the whole storage battery system with as few cells as possible, based on the cell configuration information 105 and the thermal diffusion shape information 106, and creates a list of the deterioration diagnosis target cells (Step S12). A cell that is not selected as a deterioration diagnosis target from the cells of the whole storage battery system may be referred to as a non-target cell. Here, the cell configuration information 105 includes information on a configuration of cells that are in the whole storage battery system as a diagnosis target. In the thermal diffusion shape information, all cells included in the storage battery system may be included in the list of the deterioration diagnosis target cells if heat does not diffuse at all.

Next, the cell deterioration diagnoser 102 obtains the degradation degrees of the deterioration diagnosis target cells by performing deterioration diagnosis in accordance with the list of the deterioration diagnosis target cells created in the deterioration diagnosis target cell-list creator 101 using the cell deterioration diagnosis function 108 (Step S13). Using a tendency that it is highly probable that an adjacent cell of one degraded cell is degraded, the deterioration diagnosis is performed on a cell included in deterioration diagnosis target cell list as a target without performing deterioration diagnosis of all of the cells included in the storage battery system. The degradation degree of a non-target cell is obtained by estimating from the degradation degrees of the deterioration diagnosis target cells, as described below. As a result, the degradation degree of the whole storage battery system can be obtained at high speed.

The cell deterioration diagnosis function 108 is a function to diagnose the degradation degree of one cell included in the storage battery system, and can diagnose the degradation degree of one cell selectively. As a diagnosis item, various items may be considered such as internal resistance, temperature, transient response of voltage, and physical bulge. Even in any diagnosis item, the degradation degree of the diagnosed cell is input to the temperature distribution estimator 103 through the cell deterioration diagnoser 102, and temperature distribution is estimated depending on the input item of the degradation degree. The cell deterioration diagnoser 102 issues a request of deterioration diagnosis of each cell that is a diagnosis target included in the list, to the cell deterioration diagnosis function 108, and obtains the result of the diagnosis from the cell deterioration diagnosis function 108.

Next, to the temperature distribution estimator 103, some sort of a distribution estimation technology such as a weighted average method is applied in which the whole distribution is estimated from scattered feature values based on the degradation degrees of the deterioration diagnosis target cells that are diagnosed in the cell deterioration diagnoser 102 to estimate the degradation degrees of non-target cells and estimate the temperature distribution of the whole storage battery system (Step S14). At this time, any type of distribution estimation technology may be used as long as the distribution is properly estimated.

In the end, the deterioration diagnosis target cell-list updater 104 updates the list of the deterioration diagnosis target cells to be diagnosed in the next step based on the temperature distribution of the whole storage battery system estimated using the distribution estimation technology (Step S15) in the temperature distribution estimator 103.

As a method of updating the list, in an area that reaches a certain value in the temperature distribution, the deterioration diagnosis target cell list is updated so that cells that are deterioration diagnosis targets are densely arranged based on the thermal diffusion shape information 106 used in the deterioration diagnosis target cell-list creator 101. On the other hand, outside of the area that reaches the certain value in the temperature distribution, the deterioration diagnosis target cell list is updated so that the cells that are deterioration diagnosis targets are sparsely arranged based on the thermal diffusion shape information 106 used in the deterioration diagnosis target cell-list creator 101.

By updating the list using such a method, in an area in which the change of the temperature distribution is large, further detailed temperature distribution can be estimated, and on the other hand, in an area in which the change of the temperature distribution is small, the temperature distribution can be estimated with a smaller number of diagnosis. That is, when the list of the deterioration diagnosis target cells is not updated, the deterioration diagnosis target cells are uniformly distributed in the whole storage battery system, and for example, in an area in which the temperature is uniformly distributed and the change of the temperature distribution is small, the similar result of diagnosis is obtained, so that redundancy becomes high. On the other hand, by updating the list of the deterioration diagnosis target cells, the temperature distribution can be effectively estimated because the distribution of the deterioration diagnosis target cells is dynamically changed based on the previous temperature distribution in the whole storage battery system.

As described above, in the described configuration, the temperature distribution of the whole storage battery system is successively updated by the effective selective deterioration diagnosis of cells, so that the degradation degree of the whole storage battery system can be effectively grasped eventually. In the flowchart of FIG. 2, when the degradation degree of a cell reaches limit based on a certain condition while the successively grasped temperature distribution is monitored, the following measures may be taken: replacement of the cells; replacement of a cell group that constituted by a plurality of cells that include the degraded cell and are connected in series (hereinafter referred to as a module); and determination of the end of the life in the storage battery system.

Detailed Specific Example

Figure 3:
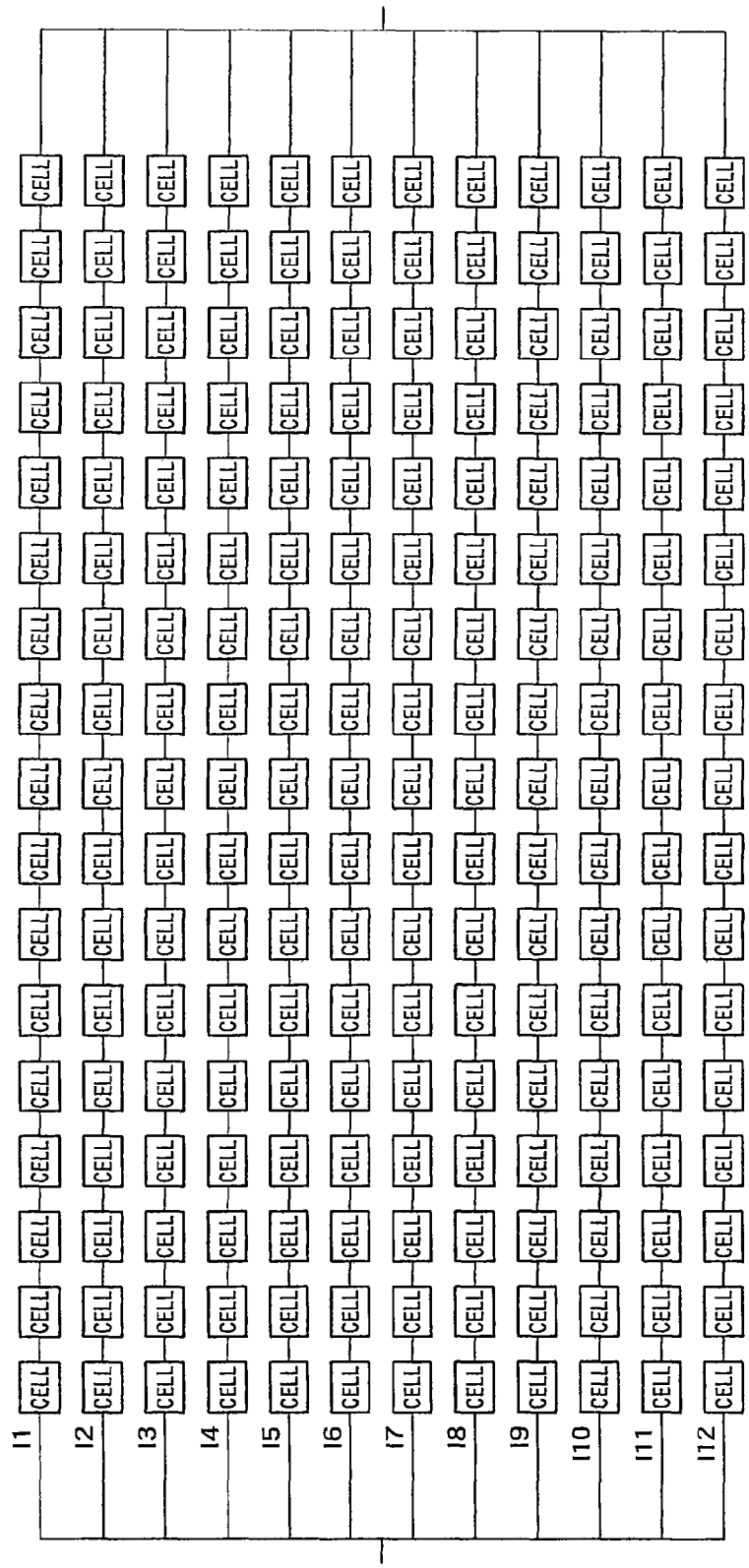
FIG. 3 is a configuration diagram of cells that constitutes a storage battery system.

The operation in the configuration according to the embodiment is described below in detail with reference to a specific cell configuration diagram as an example. FIG. 3 is a diagram illustrating a cell configuration that is assumed to account for the detailed operation. One module that is constituted by a plurality of cells connected in series includes 17 cells, and a storage battery is further constituted by connecting the 12 modules in parallel. The embodiment is not limited to the shape and the number of cells or modules of such a cell configuration, etc.

Figure 4:
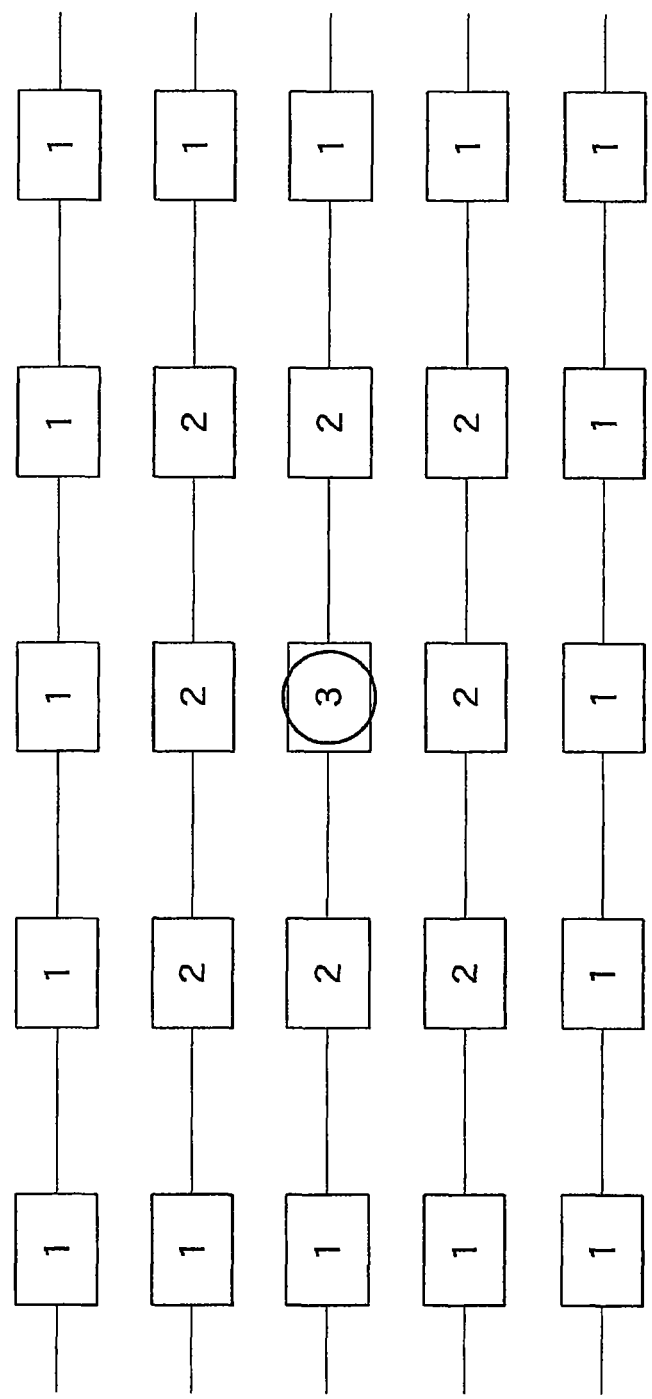
FIG. 4 is a diagram illustrating a degree of influence of the diffusion of heat from a noticed cell to another cell.

FIG. 4 illustrates an example of the thermal diffusion shape information 106. FIG. 4 illustrates a configuration in which a part of the cell configuration of FIG. 3 is extracted, and the number described in each of the cells is an index that indicates the degree of influence of heat diffusion (hereinafter referred to as a weighting factor). A numeric value of the temperature itself, or a numeric value such as an intermediate factor that is used for obtaining the temperature may be used for the index.

When the thermal diffusion shape information of a cell located in the center (hereinafter referred to as center cell) is calculated, first, the temperature of the center cell is raised to an arbitrary temperature. In this case, for example, the temperature is given for a weighting factor of "3". At this time, the temperatures of cells are measured in an approximate range up to an adjacent cell of the center cell, and an adjacent cell of the adjacent cell of the center cell to obtain weighting factors of the cells. As a result, as illustrated in FIG. 4, pieces of thermal diffusion shape information can be obtained such as a weighting factor "2" and weighting factor "1" in the cells.

The thermal diffusion shape information may be calculated by an experiment or a simulation, and any method may be used as long as the similar result can be obtained. In addition, when thermal diffusion shape information is found out already, the information does not need to be calculated in this method, and may be obtained by another method.

Figure 5:
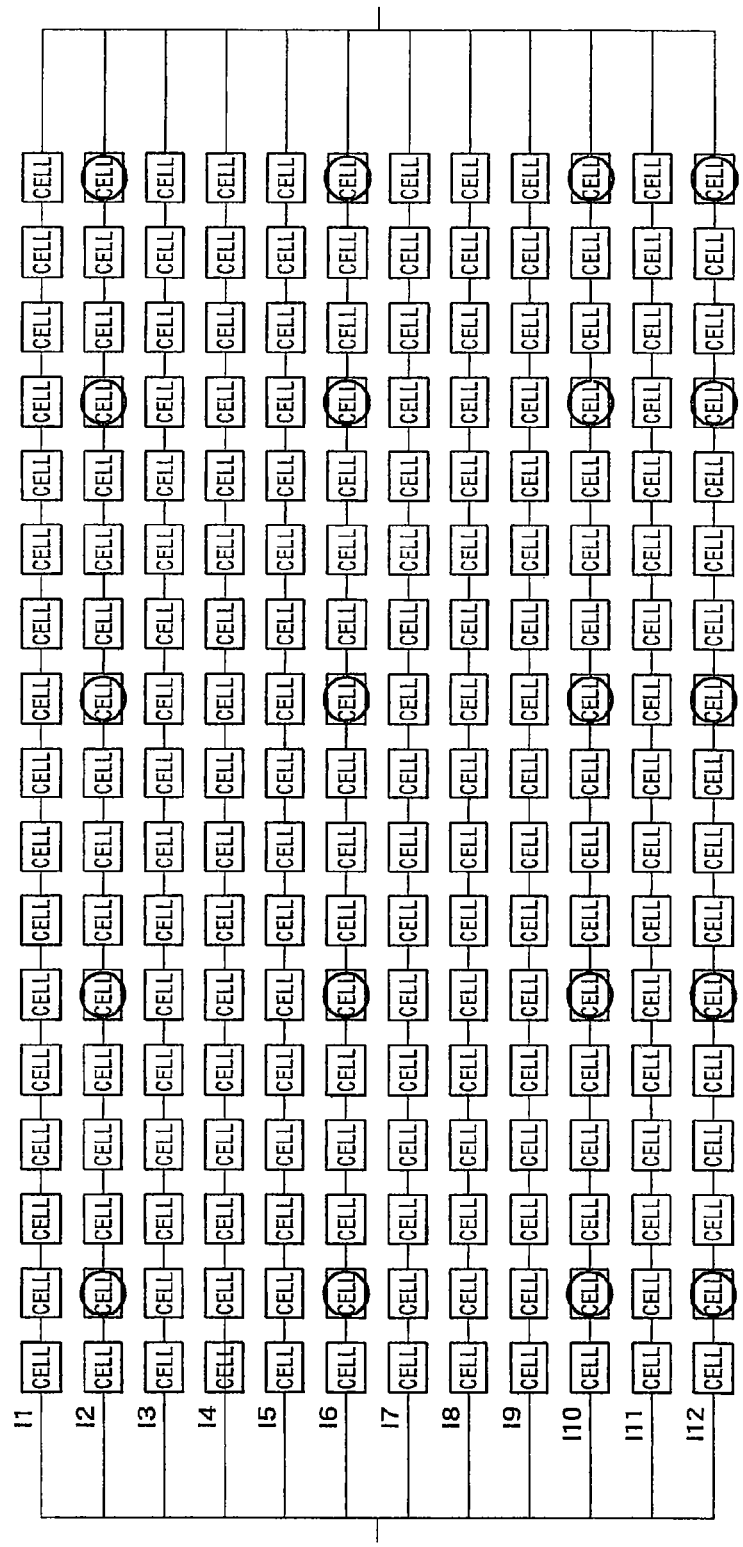
FIG. 5 is a diagram illustrating deterioration diagnosis target cells.

FIG. 5 is a cell configuration diagram illustrating deterioration diagnosis target cells. When the deterioration diagnosis target cell-list creator 101 creates a list of cells that are deterioration diagnosis targets so as to be able to comprehensively diagnose the degradation degree of the whole storage battery system with as few cells as possible, based on the cell configuration information 105 and the thermal diffusion shape information 106, the cells indicated by the circle in FIG. 5 correspond to the cells included in the list.

In the case of the cell configuration of this example, the cell configuration information 105 is information on a configuration in which 12 modules, each of which includes 17 cells that are connected in series, are connected in parallel. As illustrated in FIG. 5, in an initial stage, the temperature distribution of the whole storage battery system is estimated by comprehensively selecting cells because prior information on the temperature distribution does not exist. The degradation degrees (temperatures) of cells that are not indicated by the circle are estimated using the distribution estimation technology from the degradation degree of the nearest cell that is indicated by the circle.

A specific example of the selection method of the cells included in the list is described. When the thermal diffusion shape information 106 in FIG. 4 is used, the temperature of a cell around the center cell can be indirectly estimated by considering the weighting factors indicated in FIG. 4 from the measurement result of the temperature of the center cell. On the other hand, the temperature of a cell arranged farther than the cells around the center cell illustrated in FIG. 4 is not allowed to be indirectly estimated based on the measurement result of the temperature of the center cell because there is no weighting factor (that is, the weighting factor is "0"). Thus, it is necessary that all of the cells illustrated in FIG. 5 exist within an area other than the area of the weighting factor "0" of the thermal diffusion shape information 106 illustrated in FIG. 4, regarding the at least one cell that is indicated by the circle. In FIG. 5, all of the cells illustrated as examples are, in case in which weighting factors of the thermal diffusion shape information 106 illustrated in FIG. 4 are added using the cell indicated by the circle as a center cell, are arranged so that the weighting factors becomes two or more. The cells do not need to be arranged uniquely, a plurality of patterns of the arrangement are conceivable, and the example of FIG. 5 does not limit a pattern of a list. When one limitation condition that the weighting factors are two or more is given, one pattern may be selected from a plurality of conceivable patterns.

In this case, the example is described above in which a cells are selected using the thermal diffusion shape information 106, and alternatively, the cell may be selected without using the thermal diffusion shape information. For example, in the cell configuration in FIG. 3, a cell may be selected for each fixed distance, and the specific number of cells may be selected randomly.

FIG. 6 illustrates the list of the deterioration diagnosis target cells. The list corresponds to the cell configuration diagram in which the deterioration diagnosis target cells are indicated in FIG. 5, and for example, "cell (2,6)", etc. are recorded by combining a cell number in vertical direction in FIG. 5 and a cell number in a horizontal direction. Here, a cell that is a second cell in the vertical direction and also a 6th cell in the horizontal direction corresponds to a deterioration diagnosis target cell on the list because "2" is a cell number in the vertical direction, and "6" is a cell number in the horizontal direction. Of course, the way of creation of the list is not limited, and for example, the list may be created by another method by using a matrix in which a portion of a cell that is not a deterioration diagnosis target is set at "0" and a portion of a cell that is a deterioration diagnosis target is set at "1", etc.

Figure 7:
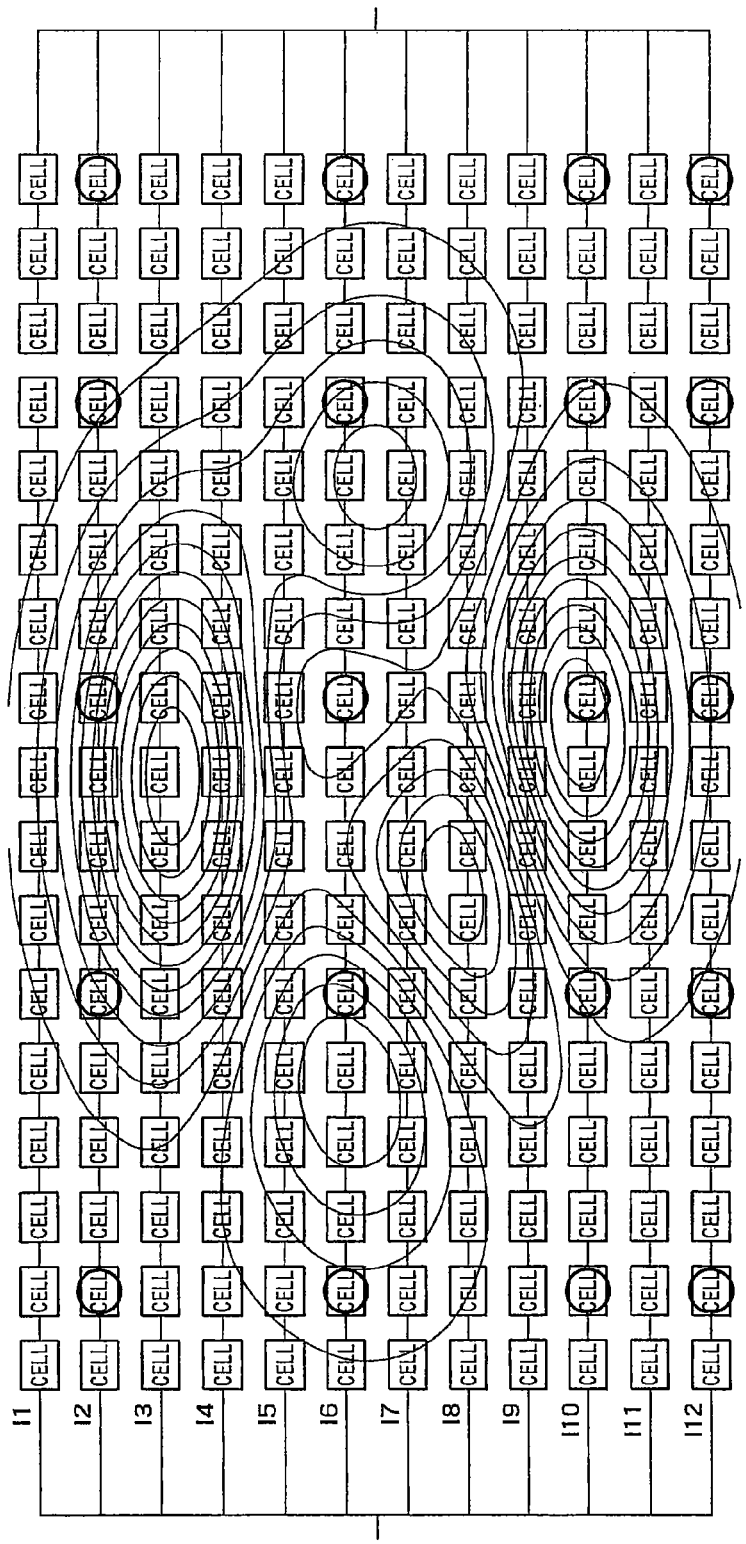
FIG. 7 is a diagram illustrating estimated temperature distribution.

FIG. 7 is a cell configuration diagram indicating the estimated temperature distribution. The cells indicated by the circle in FIG. 7 are arranged similarly to the cells indicated by the circle in FIG. 5, the deterioration diagnosis is performed on the cells as targets in the cell deterioration diagnoser 102, and the temperature distribution is estimated using the distribution estimation technology based on the cell degradation degree that is the result of the deterioration diagnosis in the temperature distribution estimator 103. The temperature distribution of the whole storage battery system is indicated by the contour in FIG. 7. For example, in the upper area of FIG.

7, the temperature is high, and in the lower area of FIG. 7, the temperature is low. In this case, in FIG. 7, the estimated temperature distribution does not have a discrete shape that follows the cells of the cell configuration, but has a continuous shape that does not follow the cells of the cell configuration. The shape depends on the distribution estimation technology and there is no problem even in the discrete shape or the continuous shape.

A specific example of the estimation of the temperature distribution is described. For the cells indicated by the circle in FIG. 7, the degradation degrees are obtained by the cell deterioration diagnoser 102. In this case, as described above, the temperature of the cell can be obtained from the degradation degree because the degradation of a cell can be explained by the temperature of the cell. When it is difficult to obtain the temperature of the cell from the degradation degree, the temperature may be set as an item diagnosed by the cell deterioration diagnoser 102. Now, each of the cells that are indicated by the circle has a numeric value of the degradation degree, and each of the cells that are not indicated by the circle does not have a numeric value of the degradation degree. Therefore, the degradation degrees of non-target cells are estimated by applying a spatial interpolation method such as an inverse distance weighted method, and the temperature distribution of the whole storage battery system is obtained from the degradation degrees of diagnosis target cells and the degradation degrees of non-target cells.

Figure 8:
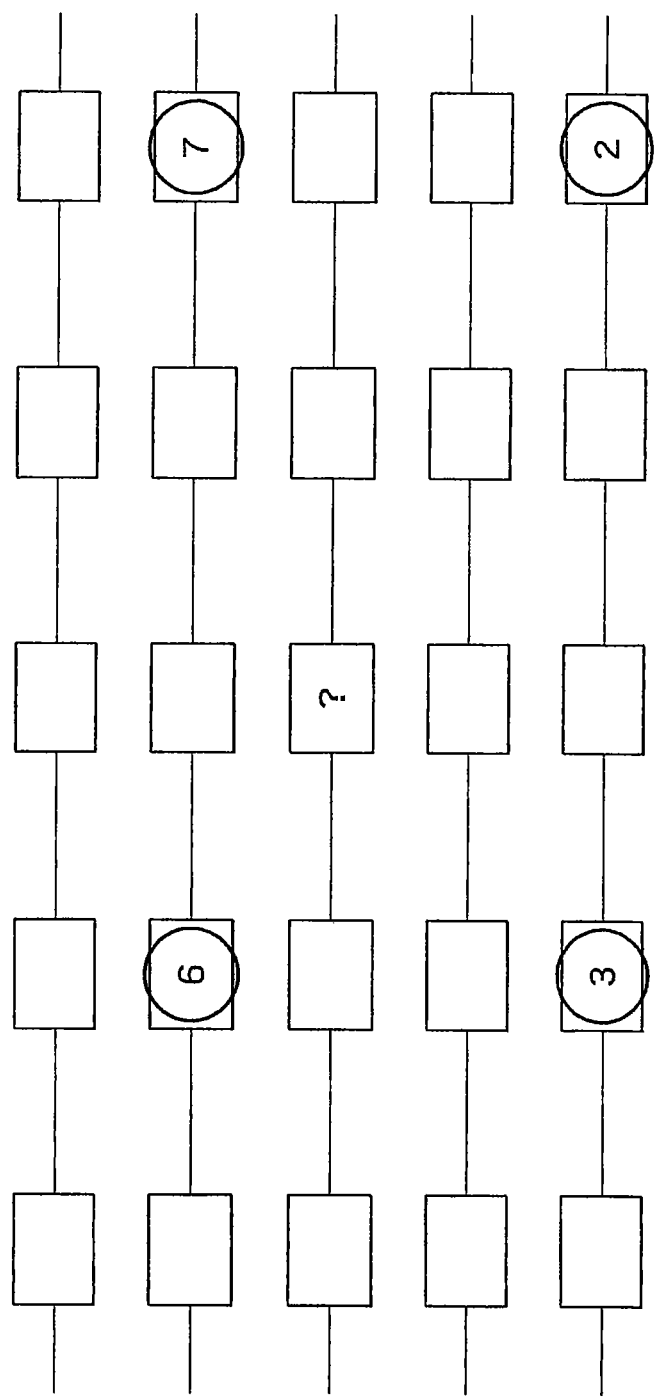
FIG. 8 is a diagram illustrating an estimation method of the degradation degree of a cell other than the deterioration diagnosis target cells.

FIG. 8 illustrates a configuration in which a small number of cells are included as compared with the configurations in FIGS. 5 and 7 in order to describe the spatial interpolation method. In FIG. 8, the degradation degrees of the cells that are indicated by the circle are obtained by the cell deterioration diagnoser 102 as described above. At this time, in FIG. 8, it is assumed that the degradation degree of the cell that is indicated by the "?" needs to be obtained. For the cells that are indicated by the circle, in a case in which a product of the degradation degree of a cell the degradation degree of which has been obtained and the inverse distance, which is used in a spatial interpolation method, is calculated, 6/2 is obtained when the cell of the degradation degree "6" on the upper left has a distance of two cell, 7/3 is obtained when the cell of the degradation degree "7" on the upper right has a distance of three cell, 3/3 is obtained when the cell of the degradation degree "3" on the lower left has a distance of three cell, and 2/4 is obtained when the cell of the degradation degree "2" on the lower right has a distance of four cell. Thus, ((6/2)+(7/3)+(3/3)+(2/4))/((1/2)+(1/3)+(1/3)+(1/4))=4.82 can be obtained by calculating an inverse distance weighted average of the values. Here, the denominator is the total of inverse distances between the cells that are indicated by the circle and the cell that is indicated by the "?", and the numerator is the total of products of the degradation degrees of the cells that are indicated by the circle and the inverse distances. Here, the distance between the cells is indicated by the number of cells, and alternatively, another physical (spatial) distance such as "cm", may be used.

It is noted that, as an example, the description is made above using the spatial interpolation method by the inverse distance weighted method, and alternatively, another method may be used as long as the temperature distribution of the whole storage battery system can be obtained from the degradation degrees of a small number of cells.

Figure 9:
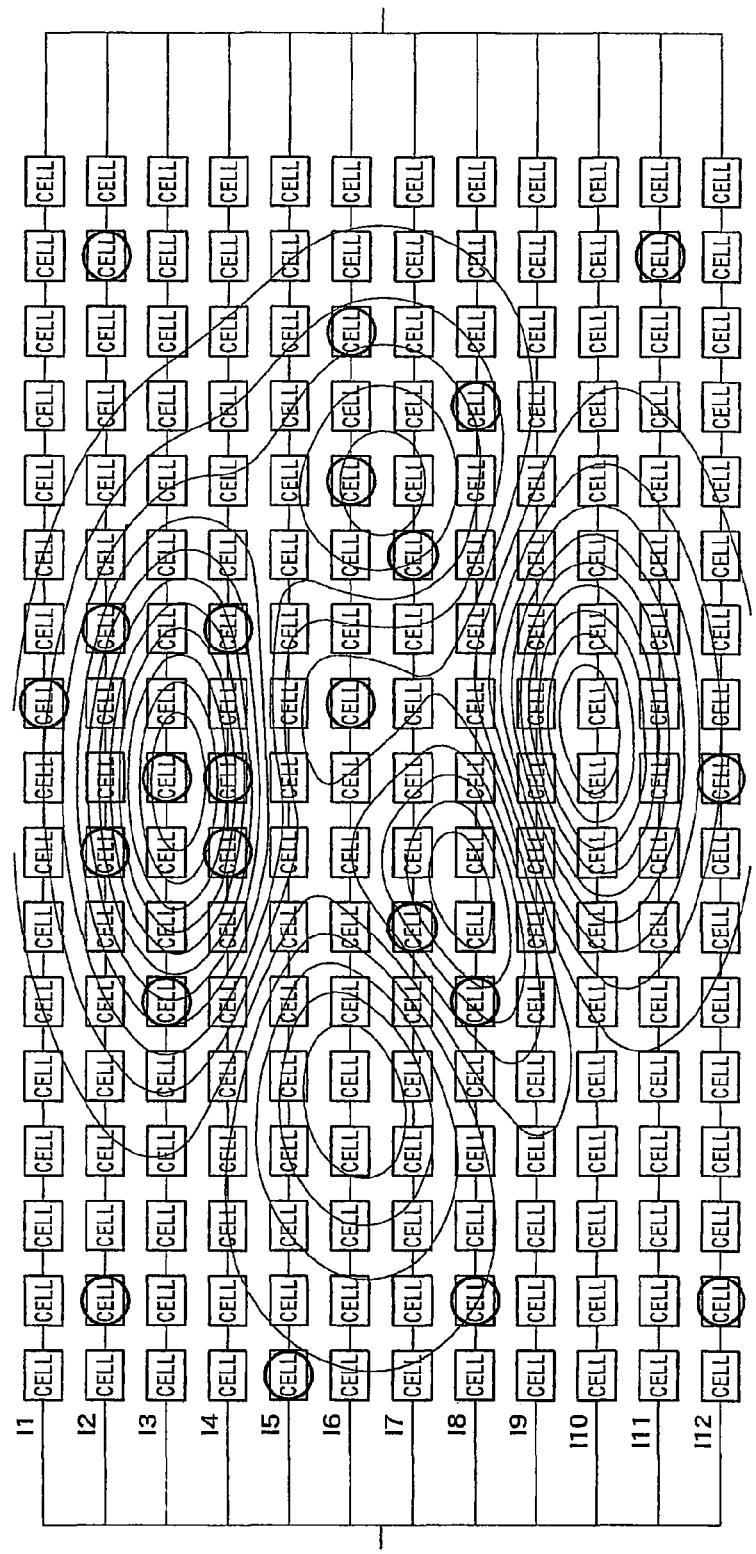
FIG. 9 is a diagram illustrating the deterioration diagnosis target cells updated based on the temperature distribution.

FIG. 9 is a cell configuration diagram illustrating the deterioration diagnosis target cells updated based on the temperature distribution. The cells that are indicated by the circle in FIG. 9 correspond to the cells included in the list of the deterioration diagnosis target cells updated in the deterioration diagnosis target cell-list updater 104. In the temperature distribution and the cells that are indicated by the circle of FIG. 9, it can be seen that the cells which are indicated by the circle exist densely in an area having a high temperature in the temperature distribution that is located in the upper area in FIG. 9. On the other hand, the cells that are indicated by the circle exist sparsely in an area having a low temperature in the temperature distribution that is located in the lower area in FIG. 9.

The calculation method is specifically described in which the deterioration diagnosis target cell-list updater 104 creates the list of cells based on the temperature distribution. For example, when the temperature distributions are obtained as illustrated in the temperature distribution of FIG. 9, the cells are classified into a plurality of classes from the result of the temperature distributions. At this time, the classes includes four classes of a class of less than 25° C., a class of 25° C. or more to less than 35° C., a class of 35° C. or more to less than 45° C., and a class of 45° C. or more, based on the temperature. In each of the four classes, in order to set limitation conditions of selection of cells described in FIG. 5, limitation conditions are set such as a limitation condition that the class of less than 25° C. has a weighting factor "2" or more, a limitation condition that the class of 25° C. or more to less than 35° C. has a weighting factor "3" or more, a limitation condition that the class of 35° C. or more to less than 45° C. has a weighting factor "4" or more, and a limitation condition that the class of 45° C. or more has a weighting factor "5" or more. That is, different threshold values are set for each of the classes, and a threshold value is set higher as the temperature of the class is higher. The list of cells is created by the method described in FIG. 5 based on these limitation conditions. Here, the classes may be updated every time in the deterioration diagnosis target cell-list updater 104, and may be updated not every time but regularly.

In the system according to the embodiment, the temperature distribution of the whole storage battery system is successively updated, and alternatively, for example, a certain threshold value is set to the temperature distribution, and a cell that exists in an area the temperature distribution of which exceeds the threshold value may be detected as a degraded cell. Thus, grasping the temperature distribution effectively corresponds to detecting the degraded cell effectively.

In addition, in a case in which the deterioration diagnosis target cell list is updated, a cell can be selected by setting a certain threshold value to the temperature distribution. For example, the cell may be selected by setting, to the temperature distribution, a threshold value based on a change amount of the temperature, that is, a time differential value.

In addition, the degradation of a cell can be explained by an increase in internal resistance, that is, is caused by decrease in a current amount that flows through a module including the cell. By using the characteristics, a cell included in a module having a small current amount may be selected on a priority basis. Here, as the reason why the priority levels are set, situations are conceivable in which an upper limit is set to the cell list, a time to diagnose deterioration is limited in an order of execution of cell deterioration diagnosis, etc., and in this case, it is necessary that the priority of a cell on which the deterioration diagnosis is performed is determined. In addition, these ideas are allowed to be applied to the detection of the degraded cells.

As described above, according to the embodiment, the degradation degrees of the cells in the whole storage battery system can be effectively grasped, and a degraded cell of a plurality of cells can be detected at high speed.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A storage battery deterioration diagnosis system, comprising:
   a cell-list creator configured to select diagnosis target cells from among a plurality of cells in a storage battery system, and create a list of the diagnosis target cells;
   a cell deterioration diagnoser configured to obtain degradation degrees of the diagnosis target cells by performing deterioration diagnosis on the diagnosis target cells on the list, or by issuing a request of deterioration diagnosis of the diagnosis target cells to an external deterioration diagnosis device;
   a temperature distribution estimator configured to estimate degradation degrees of non-target cells being cells other than the diagnosis target cells, out of the plurality of cells, on basis of the degradation degrees of the diagnosis target cells and spatial distances between the non-target cells and the diagnosis target cells, and obtain temperature distribution of a whole of the plurality of cells based on the degradation degrees of the diagnosis target cells and the degradation degrees of the non-target cells; and
   a cell-list updater configured to select second diagnosis target cells densely from an area of a higher temperature and sparsely from an area of a lower temperature in the storage battery system on basis of the temperature distribution and create a second list of the second diagnosis target cells.

2. The system according to claim 1, wherein
   the cell-list updater selects more diagnosis cells from the area having the higher temperature in the storage battery system.

3. The system according to claim 1, wherein
   the cell-list updater selects the cells from an area having a temperature of a threshold value or more in the storage battery system based on the temperature distribution.

4. The system according to claim 1, wherein
   the cell-list updater selects more cells from an area having more temperature change per unit of time.

5. The system according to claim 1, wherein
   the cell-list updater selects the cells from an area in which a temperature change per unit of time is a threshold value or greater in the storage battery system.

6. The system according to claim 1, wherein
   the cell-list updater selects the cells on a priority basis of a smaller flowing current.

7. The system according to claim 1, wherein
   the cell-list updater selects the cells based on thermal diffusion shape information that indicates a degree of influence of heat diffusion from each cell to another cells around each cell.

8. The system according to claim 7, wherein
   the cell-list updater selects the cells so that a total of degrees of influences of heat diffusion from the cells becomes a threshold value or more for each of other cells than the cells.

9. The system according to claim 7, wherein
   the cell-list updater selects the cells so that a total of degrees of influences of heat diffusion from the cells becomes a threshold value or more for each of other cells than the cells, and a larger threshold value is applied for a cell belonging to an area having a higher temperature.

10. The system according to claim 1, wherein
    the temperature distribution estimator obtains a degradation degree of the non-target cell by calculating a ratio of a total of products of degradation degrees of diagnosis target cells and inverse distances from the non-target cell to the diagnosis target cells, to a total of the inverse distances.

11. The system according to claim 7, further comprising:
    a thermal diffusion shape information calculator configured to measure, for each of the plurality of cells, an increase in temperatures of other cells around the cell when temperature of the cell is made increased, and thereby obtain the thermal diffusion shape information.

12. A non-transitory computer readable medium storing computer instructions which when executed by a computer results in performance of a storage battery deterioration diagnosis method, comprising:
    selecting diagnosis target cells from among a plurality of cells in a storage battery system, and create a list of the diagnosis target cells;
    obtaining degradation degrees of the diagnosis target cells by performing deterioration diagnosis on the diagnosis target cells on the list, or by issuing a request of deterioration diagnosis of the diagnosis target cells to an external deterioration diagnosis device;
    estimating degradation degrees of non-target cells being cells other than the diagnosis target cells, out of the plurality of cells, on basis of the degradation degrees of the diagnosis target cells and spatial distances between the non-target cell and the diagnosis target cells, and obtain temperature distribution of a whole of the plurality of cells based on degradation degrees of the diagnosis target cells and the degradation degrees of the non-target cells;
    selecting second diagnosis target cells densely from an area of a higher temperature and sparsely from an area of a lower temperature in the storage battery system on basis of the temperature distribution and creating a second list of the second diagnosis target cells;
    obtaining degradation degrees of the second diagnosis target cells on the second list by performing deterioration diagnosis on the second diagnosis target cells, or by issuing a request of deterioration diagnosis of the second diagnosis target cells to the external deterioration diagnosis device; and
    estimating degradation degrees of second non-target cells being cells other than the second diagnosis target cells, among the plurality of cells, based on the degradation degrees of the second diagnosis target cells and spatial distances between the second non-target cell and the second diagnosis target cells, and obtain second temperature distribution of a whole of the plurality of cells based on the degradation degrees of the second diagnosis target cells and the degradation degrees of the second non-target cells.

13. The system according to claim 1, wherein
    the cell deterioration diagnoser obtains degradation degrees of the second diagnosis target cells on the second list by performing deterioration diagnosis on the second diagnosis target cells, or by issuing a request of deterioration diagnosis of the second diagnosis target cells to the external deterioration diagnosis device; and the temperature distribution estimator estimates degradation degrees of second non-target cells being cells other than the second diagnosis target cells, among the plurality of cells, based on the degradation degrees of the second diagnosis target cells and spatial distances between the second non-target cell and the second diagnosis target cells, and obtain second temperature distribution of a whole of the plurality of cells based on the degradation degrees of the second diagnosis target cells and the degradation degrees of the second non-target cells.

\* \* \* \* \*